(12) United States Patent
Yamamoto et al.

(10) Patent No.: US 9,520,813 B2
(45) Date of Patent: Dec. 13, 2016

(54) ACTUATOR DRIVE DEVICE

(71) Applicant: PANASONIC CORPORATION, Osaka (JP)

(72) Inventors: Yuta Yamamoto, Osaka (JP); Shinsuke Nakazono, Osaka (JP); Akira Kurozuka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 152 days.

(21) Appl. No.: 14/237,804

(22) PCT Filed: Oct. 23, 2012

(86) PCT No.: PCT/JP2012/006763
§ 371 (c)(1),
(2) Date: Feb. 7, 2014

(87) PCT Pub. No.: WO2013/061570
PCT Pub. Date: May 2, 2013

(65) Prior Publication Data
US 2014/0159620 A1 Jun. 12, 2014

(30) Foreign Application Priority Data

Oct. 27, 2011 (JP) ................................. 2011-235768

(51) Int. Cl.
*H02N 2/00* (2006.01)
*G02B 26/08* (2006.01)
(Continued)

(52) U.S. Cl.
CPC ........ *H02N 2/0075* (2013.01); *G02B 26/0858* (2013.01); *H01L 41/042* (2013.01)

(58) Field of Classification Search
USPC .......................................................... 318/116
See application file for complete search history.

(56) References Cited

U.S. PATENT DOCUMENTS 8,998,386 B2 * 4/2015 Yonemura ............ B41J 2/04581
347/68
2005/0225201 A1 * 10/2005 Vogeley ................ H01L 41/042
310/317
(Continued)

FOREIGN PATENT DOCUMENTS

CN 1431762 7/2003
CN 1906843 1/2007
(Continued)

OTHER PUBLICATIONS

International Search Report issued in Internation Application No. PCT/JP2012/006763 mailed Jan. 29, 2013, with English translation, 3 pgs.
(Continued)

*Primary Examiner* — Eduardo Colon Santana
*Assistant Examiner* — Said Bouziane
(74) *Attorney, Agent, or Firm* — McDermott Will & Emery LLP

(57) ABSTRACT

An actuator drive device is configured to drive an actuator. The actuator drive device includes a storage section for storing a drive condition of the actuator, a processor for calculating and outputting drive signal D(t) based on a drive base signal V(t) calculated based on the drive condition with respect to time t, and a generator for outputting, based on the drive signal D(t) calculated, a driving signal for driving the actuator. The drive base signal V(t) is a sum of a fundamental wave and at least one harmonic wave of the fundamental wave. The processor is operable to determine the coefficient $a_k$ such that the drive base signal V(t) changes linearly from a minimum value to a maximum value with respect to a time. This actuator drive device improves the linearity of the driving of the actuator.

20 Claims, 10 Drawing Sheets

(51) Int. Cl.
*H01L 41/04* (2006.01)
*G02B 26/10* (2006.01)
*B41J 15/14* (2006.01)

(56) References Cited

U.S. PATENT DOCUMENTS

| | | | |
|---|---|---|---|
| 2005/0231069 A1 | 10/2005 | Yamazaki et al. | |
| 2006/0082852 A1* | 4/2006 | Wine | G02B 26/105 359/201.1 |
| 2006/0290662 A1 | 12/2006 | Houston et al. | |
| 2007/0008401 A1* | 1/2007 | Cannon | B41J 2/471 347/243 |
| 2008/0204843 A1* | 8/2008 | Yasuda | G02B 26/085 359/213.1 |
| 2009/0251756 A1* | 10/2009 | Nishizawa | G02B 26/0841 359/223.1 |
| 2009/0295256 A1 | 12/2009 | Okamura et al. | |
| 2010/0079836 A1* | 4/2010 | Rothaar | G02B 26/101 359/223.1 |
| 2010/0321752 A1* | 12/2010 | Steinert | G02B 21/0036 359/200.7 |
| 2012/0113492 A1 | 5/2012 | Nakazono et al. | |
| 2012/0281024 A1* | 11/2012 | Champion | H04N 9/3129 345/690 |
| 2012/0293850 A1* | 11/2012 | Yamamoto | G02B 26/101 359/212.1 |

FOREIGN PATENT DOCUMENTS

| | | |
|---|---|---|
| JP | 2007-043094 A | 2/2007 |
| JP | 2007-532285 A | 11/2007 |
| JP | 2008-067441 | 3/2008 |
| JP | 2008-193874 | 8/2008 |
| JP | 2010-092018 | 4/2010 |
| JP | 2010-092018 A | 4/2010 |
| JP | 2012-503794 A | 2/2012 |
| WO | 2005/098983 A2 | 10/2005 |
| WO | 2010/036504 A2 | 4/2010 |
| WO | 2010/122751 A1 | 10/2010 |

OTHER PUBLICATIONS

English Translation of Chinese Search Report dated Dec. 30, 2015 for the related Chinese Patent Application No. 201280052133.2.

* cited by examiner

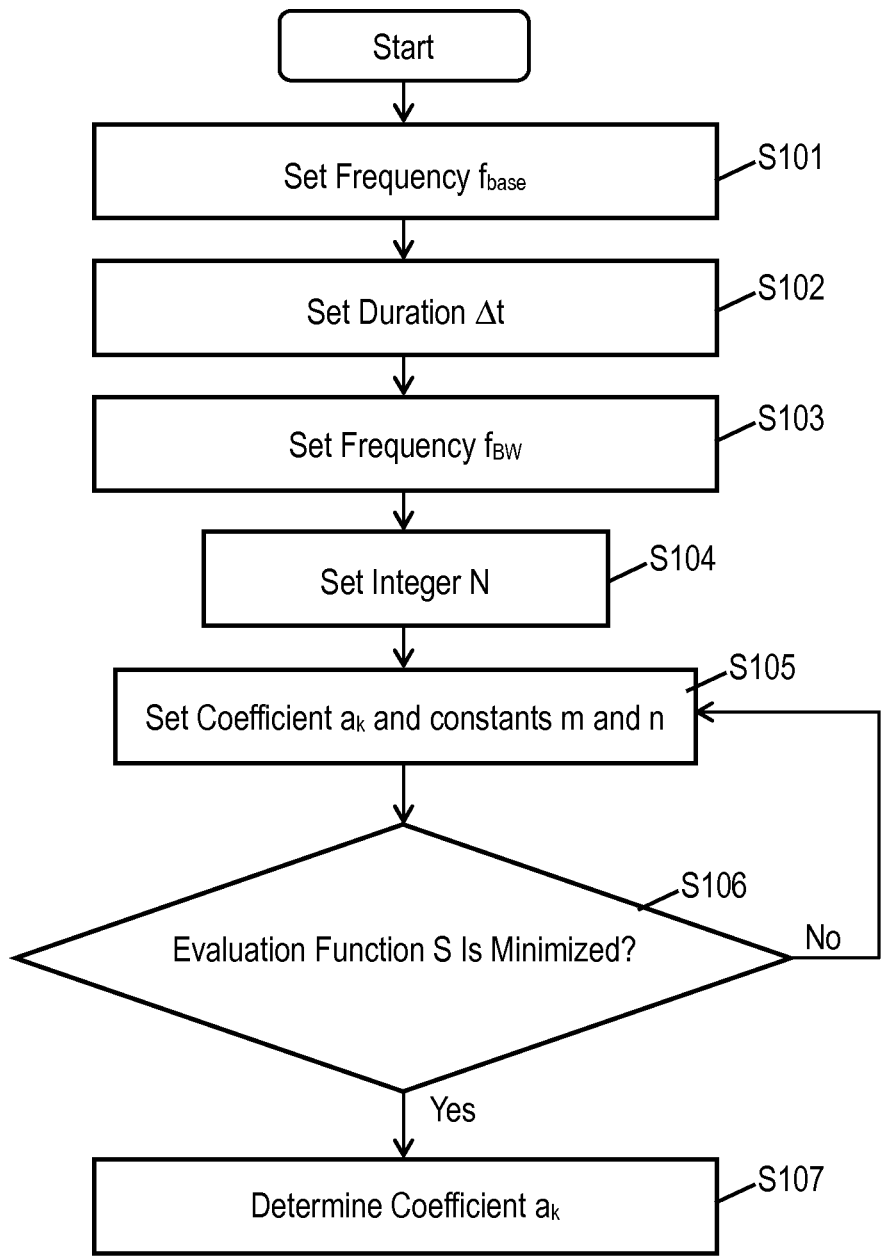

FIG. 8B

| Coefficient $a_k$ | $a_1$ | $a_2$ | $a_3$ | $a_4$ | $a_5$ | $a_6$ | $a_7$ | $a_8$ | $a_9$ | $a_{10}$ |
|---|---|---|---|---|---|---|---|---|---|---|
| Saw-Tooth Wave $W_O$ | 1 | 0.5 | 0.333 | 0.25 | 0.2 | 0.167 | 0.143 | 0.125 | 0.111 | 0.1 |
| Saw-Tooth Wave $W_V$ | 1 | 0.442 | 0.238 | 0.129 | 0.063 | 0.023 | −0.000 | −0.011 | −0.013 | −0.011 |

| Coefficient $a_k$ | $a_{11}$ | $a_{12}$ | $a_{13}$ | $a_{14}$ | $a_{15}$ | $a_{16}$ | $a_{17}$ | $a_{18}$ | $a_{19}$ | $a_{20}$ |
|---|---|---|---|---|---|---|---|---|---|---|
| Saw-Tooth Wave $W_O$ | 0.091 | 0.083 | 0.077 | 0.071 | 0.067 | 0.063 | 0.059 | 0.056 | 0.053 | 0.005 |
| Saw-Tooth Wave $W_V$ | −0.008 | −0.004 | −0.001 | 0.001 | 0.002 | 0.002 | 0.001 | 0.001 | 0.000 | 0.000 |

ACTUATOR DRIVE DEVICE

RELATED APPLICATIONS

This application is the U.S. National Phase under 35 U.S.C. §371 of International Application No. PCT/JP2012/006763, filed on Oct. 23, 2012, which in turn claims the benefit of Japanese Application No. 2011-235768, filed on Oct. 27, 2011, the disclosures of which are incorporated by reference herein.

TECHNICAL FIELD

The present invention relates to an actuator drive device configure to drive an actuator which vibrates.

BACKGROUND ART

An on-vehicle radar and a projection-type optical scanner scanning a light beam emitted from a light source, such as a laser or an LED, in two-axis directions perpendicular to each other have been commercialized. Each of these optical scanners includes a light source, an actuator, and an actuator drive device that drives and controls the actuator.

The actuator includes a reflector, a driver for rotating the reflector, and a drive electrode for vibrating the driver. The driver rotates the reflector about two operational axes perpendicular to each other. The drive electrode vibrates and drives the driver such that the reflector can rotate and vibrate at a predetermined drive frequency. The reflector reflects a light beam emitted from the light source, and, for instance, scans the light beam in two-dimensional directions as to display an image by raster scanning. In this case, the actuator drives the reflector in a horizontal direction with a sine wave, and drives the reflector in the vertical direction with a saw-tooth wave.

Patent Literature 1 discloses a conventional actuator.

This actuator drives a reflector with a saw-tooth wave, thereby displaying an image. If a drive signal contains a resonance frequency peculiar to the actuator, the reflector may vibrate with an unintended waveform. Patent Literature 1 also discloses that a component of the resonance frequency contributing to the unintended vibration is removed from the driving signal so as to suppress the resonant vibration.

The removal of the component of the resonance frequency from the drive signal, however, degrades a linearity of the drive signal, and for instance, may produce a distortion of the image displayed by the optical scanner, thus causing the image quality to deteriorate.

CITATION LIST

Patent Literature

Patent Literature 1: Japanese Patent Laid-Open Publication No. 2010-92018

SUMMARY

An actuator drive device is configured to drive an actuator. The actuator drive device includes a storage section for storing a drive condition of the actuator, a processor for calculating and outputting drive signal D(t) based on a drive base signal V(t) calculated based on the drive condition with respect to time t, and a generator for outputting, based on the drive signal D(t) calculated, a driving signal for driving the actuator. The drive base signal V(t) is a sum of a fundamental wave and at least one harmonic wave of the fundamental wave, and is expressed as formula (1) with an amplitude A, an integer N, a coefficient $a_k$, a frequency $f_{base}$ of the fundamental wave, an integer k ($1 \leq k \leq N$):

$$V(t) = A \sum_{k=1}^{N} a_k \sin(2\pi f_{base} k t). \quad (1)$$

The processor is operable to determine the coefficient $a_k$ such that the drive base signal V(t) changes linearly from a minimum value to a maximum value with respect to a time.

This actuator drive device improves the linearity of the driving of the actuator.

BRIEF DESCRIPTION OF DRAWINGS

FIG. 8A is a flowchart of an operation of the actuator drive device in accordance with Embodiment 1.

FIG. 8B shows coefficients of the actuator drive device in accordance with Embodiment 1.

DETAIL DESCRIPTION OF PREFERRED EMBODIMENTS

Exemplary Embodiment 1

Figure 1:
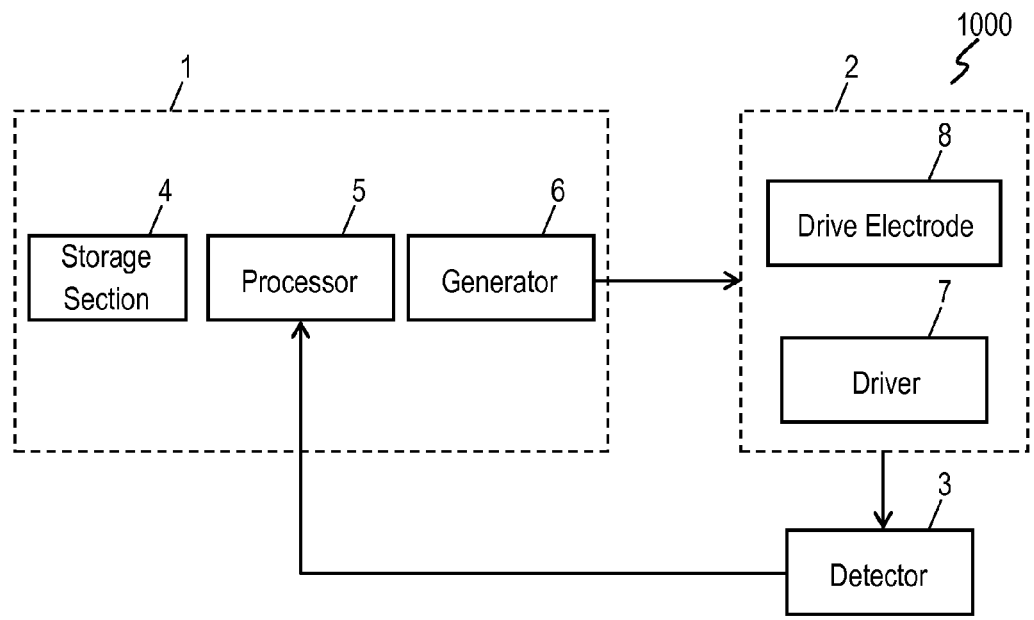
FIG. 1 is a block diagram of an actuator drive device and an actuator in accordance with Exemplary Embodiment 1 of the present invention.

FIG. 1 is a schematic view of optical scanner 1000 in accordance with Exemplary Embodiment 1 of the present invention. Optical scanner 1000 includes actuator drive device 1, actuator 2 to be driven by actuator drive device 1, and detector 3.

Actuator drive device 1 includes storage section 4 for storing a predetermined drive condition previously input therein, processor 5 for calculating a drive signal based on the stored drive condition to calculate a predetermined waveform, and generator 6 for producing the drive signal calculated by processor 5.

Figure 2:
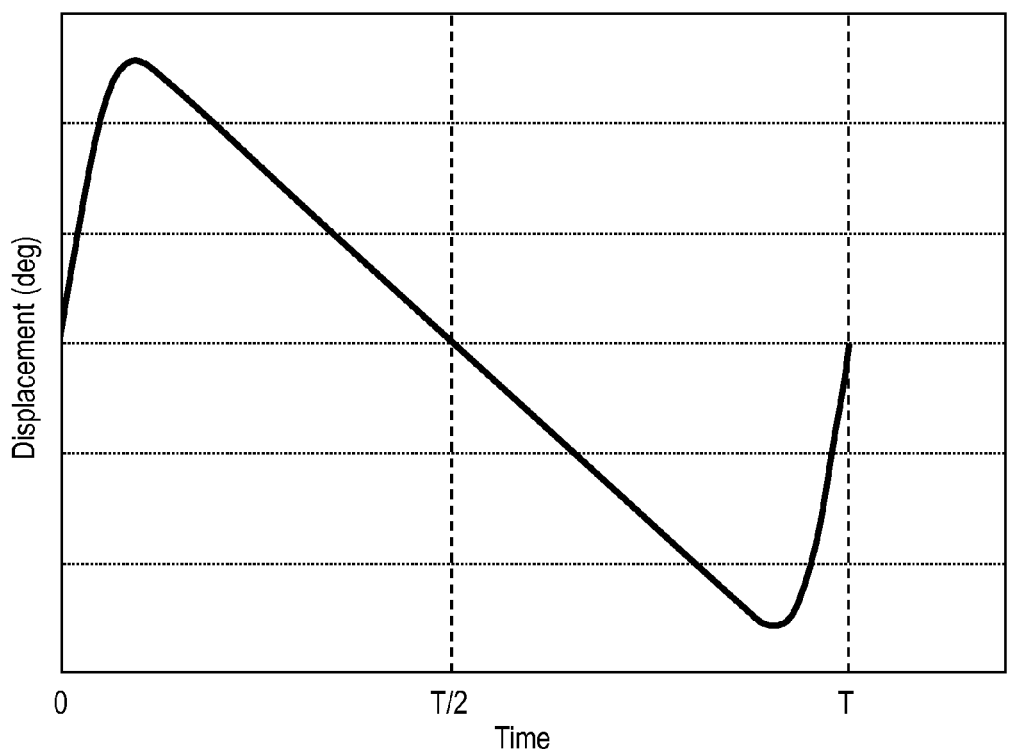
FIG. 2 shows a waveform that drives the actuator in accordance with Embodiment 1.

Storage section 4 stores a drive frequency of actuator 2, a drive frequency band to be used for driving actuator 2, and a duration for which actuator 2 moves in response to the drive signal per one period which are predetermined. The conditions previously stored in storage section 4 can be changed or adjusted with en external input at an appropriate timing. Based on the drive frequency, the frequency band, and the duration per one period of the drive signal stored in storage section 4, processor 5 calculates a drive signal to drive actuator 2. Based on the calculation result of processor 5, generator 6 produces a driving signal having a voltage and a current adjusted for driving the actuator 2, and then drives actuator 2 to cause actuator 2 to vibrate with a predetermined saw-tooth wave shown in FIG. 2.

Actuator 2 includes drivers 7 the number of which corresponds to the number of axes to be driven, and drive electrode 8 for driving drivers 7. Actuator 2 is driven along an axial direction in response to an electrical drive signal produced by generator 6 of the actuator drive device. Actuator 2 has vibration modes in response to its resonance frequency characteristics, and each vibration mode has a frequency characteristic thereof. Actuator 2, upon being driven with the saw-tooth wave, may not exhibit a predetermined linearity during the drive of actuator 2.

Detector 3 detects a movement of driver 7 based on the reflection of laser beam, and feeds back the detected signal to processor 5 for calculating a difference between the movement of driver unit 7 and a desirable driving waveform, thereby correcting the movement. An external disturbance, such as vibration or temperature, changes the resonance frequency, thereby causing a distortion in the movement of actuator 2. Detector 3 can restrict the distortion of actuator 2 within a certain range. Detector 3 may be implemented by an optical detector that detects the movement of actuator 2 based on the reflection of laser beam, or by another detector that detects mechanical vibration of actuator 2. Detector 3 can be integrated into actuator 2. In this case, piezoelectric-type actuator 2 equipped with driver 7 including a piezoelectric element may include detector 3 for detecting the movement through piezoelectric effect.

Figure 3:
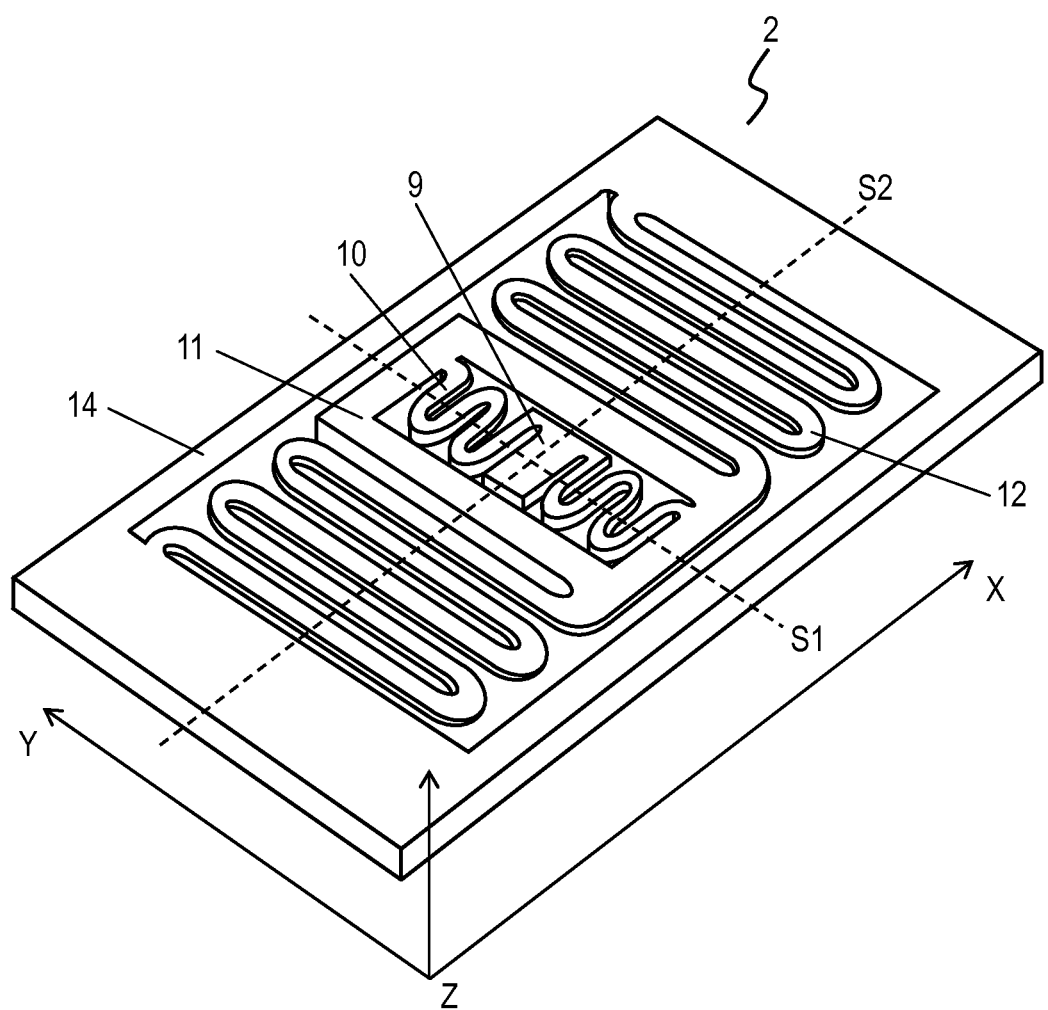
FIG. 3 is a perspective view of the actuator in accordance with Embodiment 1.

Next, actuator 2 will be described below. FIG. 3 is a perspective view of actuator 2 which includes object 9, driver 10, frame 11, driver 12, and frame 14. Object 9 is a mirror that reflects light. One end of driver 10 is connected to object 9 and another end of driver 10 is connected to frame 11. Driver 10 rotates object 9 about axis S1. One end of driver 12 is connected to frame 11, and another end of driver 12 is connected to frame 14. Driver 12 rotates frame 11, driver 10, and object 9 about axis S2 perpendicular to axis S1. Each of drivers 10 and 12 has a meandering beam shape having portions of predetermined lengths folded plural times.

Since drivers 10 and 12 has the meandering beam shapes, displacements of the portion folded plural times can be accumulated to increase a displacement amount or a rotational angle, thereby providing the same effect as a long beam. Drivers 10 and 12 correspond to driver 7 of actuator 2 shown in FIG. 1.

Each of drivers 10 and 12 includes a Si substrate and drive electrode 8 disposed on the Si substrate. Drive electrode 8 includes a lower electrode disposed on the Si substrate, a piezoelectric body disposed on the lower electrode, and an upper electrode disposed on the piezoelectric body. Each of drivers 10 and 12 can be driven by an alternating-current (AC) voltage having a constant frequency applied between the upper electrode and the lower electrode of drive electrode 8.

Each of drive electrode 8 and a detection electrode is disposed on respective one of piezoelectric bodies that are independently formed on drivers 10 and 12, thereby driving actuator 2 and detecting the movement of actuator 2 on the same beam. The detection electrode detects an electric charge generated when drivers 10 and 12 are driven as to function as detector 3 for detecting the movement of actuator 2.

Actuator 2 shown in FIG. 3 is a two-axis driven actuator that can be driven for rotating a mirror about two axes S1 and S2 perpendicular to each other; however, a one-axis driven actuator that can be driven for rotating a mirror about one axis may have the same effects.

An operation of actuator drive device 1 will be described below. In actuator 2 in accordance with Embodiment 1, a driving signal of sine wave is input to driver 10 while another driving signal of saw-tooth wave is input to driver 12, thereby performing a raster scan with driving object 9. An operation of driver 12 which acts as driver 7 shown in FIG. 1 and receives the driving signal of saw-tooth wave will be described below.

Figure 4:
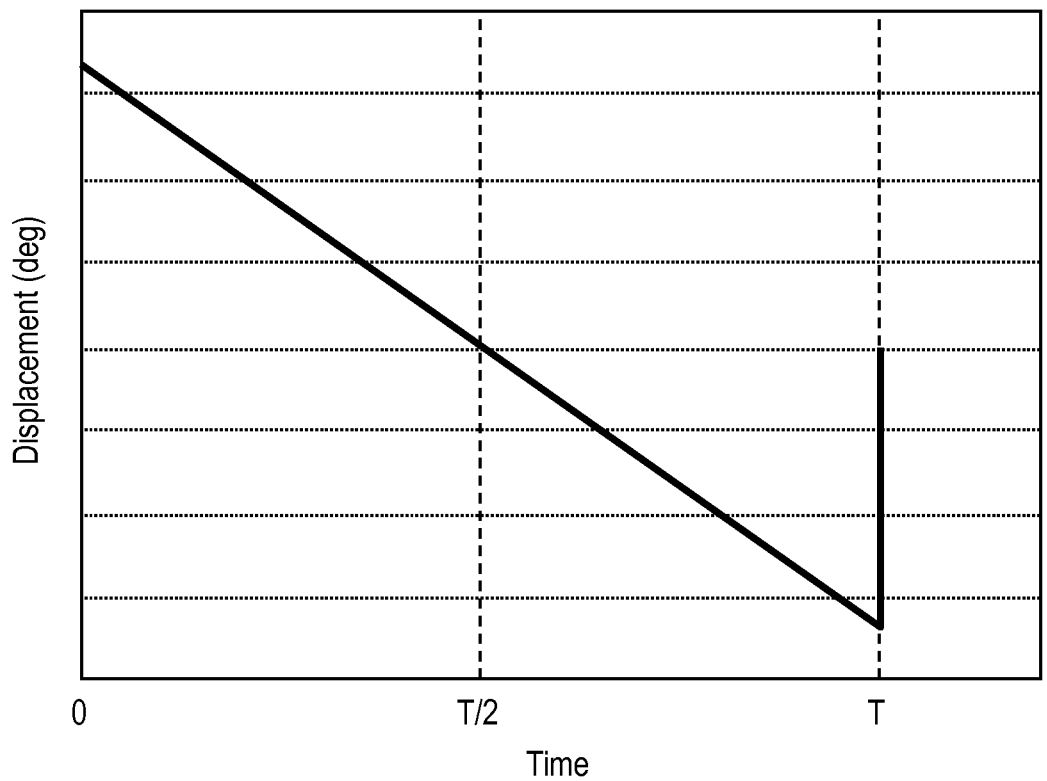
FIG. 4 shows a locus of an object of the actuator driven by the actuator drive device in accordance with Embodiment 1.

FIG. 4 shows displacement x(t) of object 9 driven by driver 12 when driver 12 receives one cycle of the driving signal of ideal saw-tooth wave. The ideal saw-tooth wave is expressed as formula (2) with base frequency $f_{base}$ which is the drive frequency of object 9 vibrating to rotate about axis 2, an integer k, and a time t:

$$x(t) = \frac{2}{\pi} \sum_{k=1}^{\infty} \frac{\sin(2\pi f_{base} kt)}{k}. \qquad (2)$$

Figure 5:
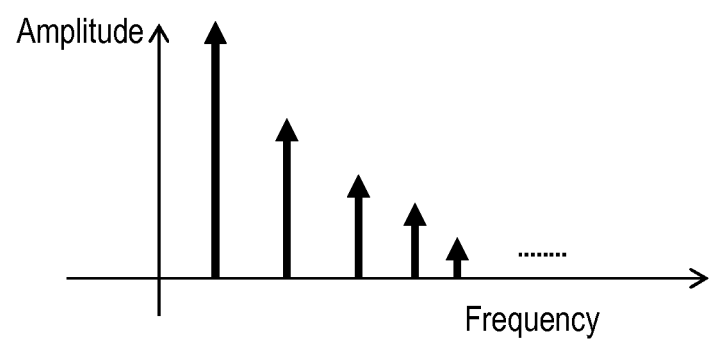
FIG. 5 shows a harmonic component for producing an ideal saw-tooth wave.

The waveform of displacement x(t) is formed by infinitely summing a base order of a base wave having frequency $f_{base}$ and k-order harmonic waves having frequency $kf_{base}$, amplitude of 1/k of the basic order, and the same phase as the base wave of the base order. Displacement x(t) has an extreme value of its locus at a rising time (t=0 s), and changes at a constant speed to the next extreme value. FIG. 5 shows amplitudes of the harmonic waves of the ideal saw-tooth wave.

Figure 6:
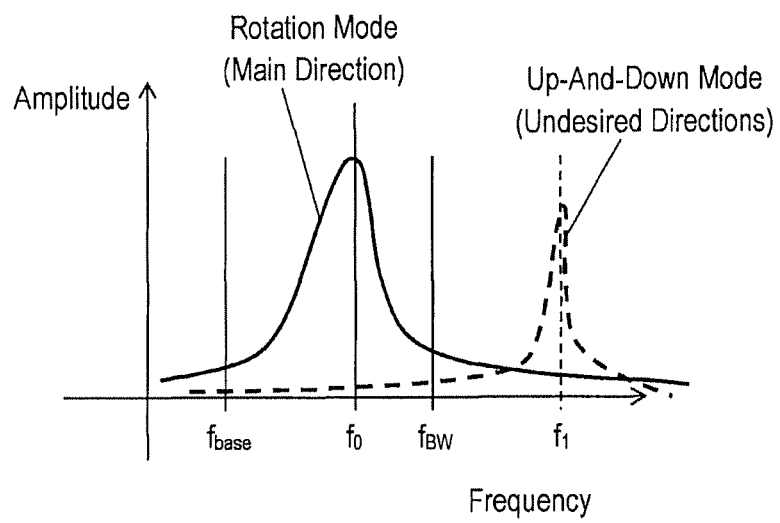
FIG. 6 shows frequency characteristics of amplitude of vibration of the actuator in accordance with Embodiment 1.

Driver 7 of actuator 2 has two resonance frequencies $f_0$ and $f_1$ in response to a frequency of the driving signal supplied to driver 7. Resonance frequency $f_0$ is a resonance frequency of a rotating mode in which object 9 rotates about axis S2. Resonance frequency $f_1$ is a resonance frequency of an up-and-down mode in which object 9 moves reciprocally in up-and-down directions different from the rotating direction. The rotating direction is a main direction of object 9 driven by driver 7. The up-and-down directions are perpendicular to axes S1 and S2, and are undesired directions for object 9 driven by driver 7. FIG. 6 shows relations between the vibration modes and the resonance frequencies of actuator 2.

According to Embodiment 1, the mirror as object 9 is scanned in the direction rotating about axes S1 and S2. If the driving signal contains resonance frequency $f_0$ for the rotating mode of driver 7, driver 7 resonates and the rotating mode is excited, hence amplifying the driving signal. If the driving signal contains resonance frequency $f_1$ for the up-and-down mode of driver 7, the up-and-down mode is excited, hence driving object 9 along the up-and-down directions that do not contribute to the scan. Object 9 thus receives unintended driving force, and cannot be scanned preferably. Since the up-and-down mode does not contribute to scanning object 9 is useless to actuator 2, some measures are taken against this useless mode when actuator 2 is driven. When actuator 2 is driven with the driving signal of ideal saw-tooth wave expressed as formula (2), the saw-tooth wave is produced by infinitely adding harmonic waves of frequency $kf_{base}$ at order k of base frequency $f_{base}$. Actuator 2 has plural resonance frequencies including frequency $kf_{base}$ matching with resonance frequency $f_1$ that excites the useless mode. The frequency $kf_{base}$ causes the useless mode to be superposed on the main mode.

Figure 7:
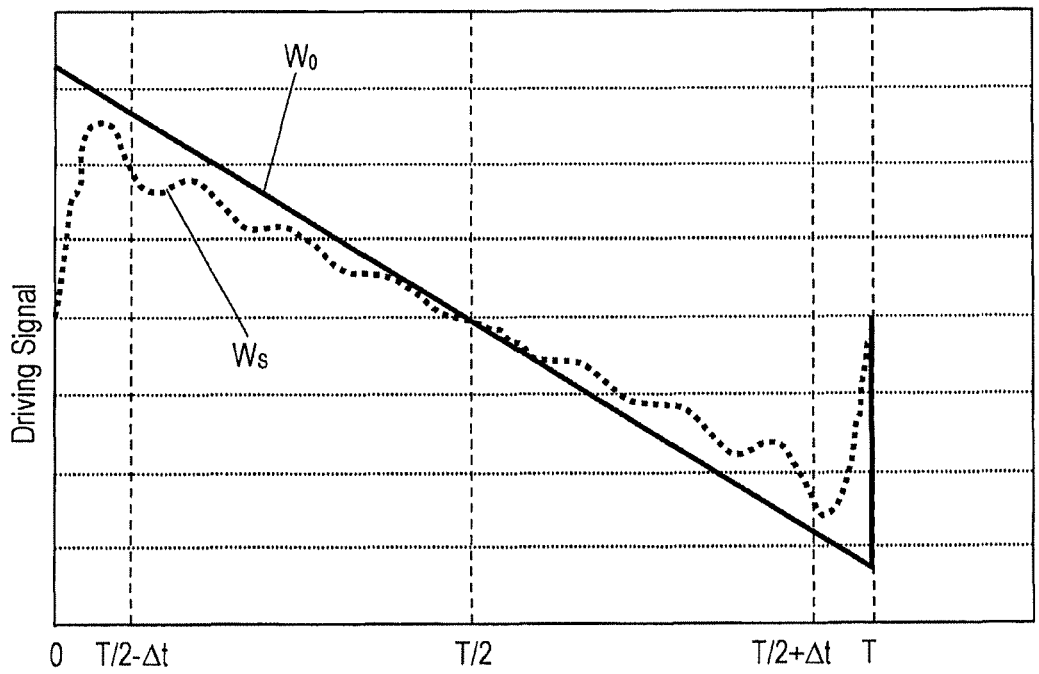
FIG. 7 shows a saw-tooth waveform with a limited frequency band.

To drive actuator 2 without exciting the useless mode, the harmonic wave out of the harmonic waves having the frequency that excites the useless mode is removed, and is added for producing the saw-tooth wave. However, the saw-tooth wave thus produced has less linearity in the drive signal than the ideal saw-tooth wave, so that the drive signal tends to be degraded. FIG. 7 shows ideal saw-tooth wave $W_0$ and saw-tooth wave $W_S$ in which the maximum frequency of the harmonic wave is limited.

The linearity of the driving signal used for rotating actuator 2 matching with the straight line from the extreme value at the rise time to the next extreme value within one period in the drive waveform of the ideal saw-tooth wave is measured, and this matching rate is referred to as the linearity. This linearity of the driving signal is evaluated within the period from $T/2-\Delta t$ to $T/2+\Delta t$ out of a period from the rise time "0" to period T of the saw-tooth wave. The duration $\Delta t$ is a half of a period during which actuator 2 is driven linearly. As shown in FIG. 7, the saw-tooth wave containing harmonic waves of which band is limited has a low linearity of about 3% of the ideal saw-tooth wave within the duration from $T/2-\Delta t$ to $T/2+\Delta t$. As discussed above, saw-tooth wave $W_S$ has the small linearity of 3%, so that the image scanned by actuator 2 is distorted from an ideal image. As a result, actuator 2 having resonance frequency $f_1$ which excites the useless mode needs a driving signal that allows producing a high linearity, even when the frequency of the harmonic wave is limited, for driving object 9 linearly in a predetermined mode free from exciting the useless mode.

In actuator drive device 1 in accordance with Embodiment 1, processor 5 produces drive base signal V(t) expressed as formula (3) with amplitude A, integer k (1≤k≤N), coefficient $a_k$, and predetermined integer N which can be determined arbitrarily.

$$V(t) = A\sum_{k=1}^{N} a_k \sin(2\pi f_{base}kt) \quad (3)$$

Evaluation function S that determines coefficient $a_k$ is expressed as formula (4) with duration $\Delta t$ and predetermined constants m and n. Coefficient $a_k$ is a value that minimizes evaluation function S.

$$S = \sum_{T/2-\Delta t}^{T/2+\Delta t} |V(t) - (mt+n)|^2 \quad (4)$$

An external input prompts actuator drive device 1 to set base frequency $f_{base}$, duration $\Delta t$, upper limit frequency $f_{BW}$, and amplitude A.

Processor 5 outputs drive base signal V(t) as drive signal D(t). When bias X is applied to the harmonic wave, processor 5 calculates and outputs drive signal D(t) (=$D_1$(t)) expressed as formula (5).

$$D(t) = D_1(t) = V(t) + X = A\sum_{k=1}^{N} a_k \sin(2\pi f_{base}kt) + X \quad (5)$$

For instance, in the case that actuator drive device 1 is used a raster-scan display device, base frequency $f_{base}$ is determined based on a frame rate of the display device. For instance, when the frame rate is 60 frames per sec, i.e., 60 fps, base frequency $f_{base}$ is set to 60 Hz. When the frame rate is 30 fps, base frequency $f_{base}$ is set to 30 Hz. Since duration $\Delta t$ is a half of the time during which the linearity of the saw-tooth wave is maintained, duration $\Delta t$ relates to a video displaying time per frame of the display device. In order to process a video signal to be scanned with the beam supplied from the actuator, a time (T−2$\Delta t$) other than a linear operation time is necessary. Taking this time into consideration, namely, about 20% of one frame needs for processing the video signal, duration $\Delta t$ is 0.4/60 s.

In the case that actuator 2 is driven with a driving signal of saw-tooth wave, frequency $f_{BW}$ for removing the useless mode is determined. Actuator 2 shown in FIG. 6 is designed to satisfy the relation of $f_{base} < f_0$ with the resonance frequency $f_0$ of the main mode the base frequency $f_{base}$. In this case, frequency $kf_{base}$ of harmonic wave at order k, which is a component of dive base signal V(t) and is used for producing the saw-tooth wave, is included in the range of $f_{base} \le kf_{base} \le f_{BW} < f_1$. Resonance frequency $f_1$ of the useless mode is not included in this range. Frequency $f_{BW}$ to be used for removing the useless mode preferably satisfies the relation of formula (6) with amplitude characteristic $A_d(f)$ (dB) with respect to the frequency of the main mode and amplitude characteristic $A_u(f)$ (dB) with respect to the frequency of the useless mode of actuator 2.

$$A_d(f_{BW}) > A_u(f_{BW}) + 3 \text{ dB} \quad (6)$$

When actuator 2 is driven at frequency $f_{BW}$ that satisfies formula (6), a displacement amount of the actuator in the main mode is greater than that in the useless mode by not smaller than 50%. This configuration reduces useless vibration caused by actuator 2, and allows actuator 2 to provide a display without distortion in scanning lines.

Frequency $f_{BW}$ may be determined based on resonance frequencies $f_0$ and $f_1$ by another method. Resonance frequency $f_0$ of the main mode of driver 12 having the meander beam shape of actuator 2 is set at 700 Hz, and resonance frequency $f_1$ of the useless mode thereof is set at 1400 Hz. In this case, secondary vibration mode 1400 Hz in the main mode becomes a useless harmonic wave vibration mode, so that it is necessary to remove adverse effect of this vibration. Upon actuator 2 being designed, frequency $f_1$ is set to about 1400 Hz for removing the adverse effect of the useless mode. To meet this objective, frequency $f_{BW}$ is set to, for instance, 1200 Hz lower than frequency $f_1$ in order to avoid the adverse effect caused by the vibration in the useless mode. Since actuator 2 thus designed has the resonance frequency $f_1$ of 1400 Hz in the useless mode, even if frequency $f_{BW}$ is determined to be uniquely at 1200 Hz, the characteristics of the useless vibration may not change so much. This method thus can save a large amount of time necessary for calculating frequency $f_{BW}$ that satisfies formula (6) for each actuator.

The above setting of frequency $f_{BW}$ causes the amplitude of the useless mode to be sufficiently smaller than that of the main mode, prevents actuator 2 from being driven by the useless mode when a predetermined saw-tooth wave is produced, and allows the display device to display an image without distortion in scanning lines.

Next, in the frequency band limited by frequency $f_{BW}$, integer N is calculated based on the relation of $Nf_{base} < f_{BW}$, and then, coefficient $a_k$ in formula (3) is calculated so as to increase the linearity of the saw-tooth wave, thereby improving the linearity of drive base signal V(t). FIG. 8A is a flowchart of setting these parameters. First, the drive frequency, namely base frequency $f_{base}$ is set based on the condition delivered from storage section 4 (Step S101). Then, duration $\Delta t$ is set (Step S102). Next, frequency $f_{BW}$ is set (Step S103), integer N is set (Step S104), and then, coefficient $a_k$ and constants m and n are set (Step S105). Then, evaluation function S is calculated, and it is determined whether or not the calculated value of function S is minimized (Step S106). When the value of evaluation function S is not minimized in Step S106, coefficient $a_k$ and constants m and n are set again in Step S105 and it is determined whether or not the value of function S is minimized in Step S106. Coefficient $a_k$ and constants m and n are sequentially changed as above for finding coefficient $a_k$ that minimizes the value of evaluation function S.

For instance, in the case that the foregoing parameters are used, resonance frequency $f_1$ is set to 1430 Hz, base frequency $f_{base}$ (i.e. a drive frequency) is set to 60 Hz, duration $\Delta t$ is set to 0.4/60 (s), amplitude A is set to 1.28. Predetermined frequency $f_{BW}$ is set to 1246 Hz based on formula (5), or is uniquely set to 1200 Hz. In both cases, integer N in formula (3) is set to 20.

In this case, coefficients $a_1$ to $a_{20}$ are adjusted such that evaluation function S in formula (4) is minimized. Coefficients $a_1$ to $a_{20}$ that minimize evaluation function S and constants m and n are calculated repetitively by the Newton's method or split-half method. FIG. 8 shows each value of coefficients $a_k$.

Figure 9:
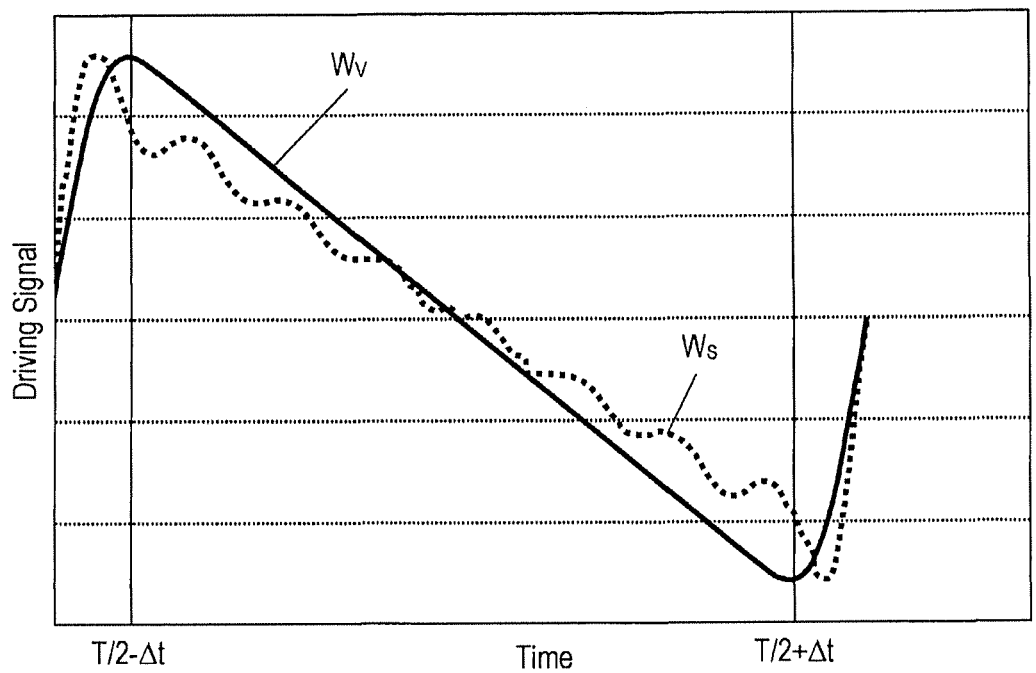
FIG. 9 shows a waveform calculated by a processor of the actuator drive device in accordance with Embodiment 1.

FIG. 9 shows saw-tooth wave $W_V$ produced by using coefficient $a_k$ shown in FIG. 8B, and further shows saw-tooth wave $W_S$ shown in FIG. 7 and produced by simply limiting the order. As shown in FIG. 9, drive base waveform ($W_V$) has linearity higher than that of saw-tooth wave $W_S$ having the limited order of harmonic waves. During duration from T/2−$\Delta t$ to T/2+$\Delta t$, the linearity of saw-tooth wave $W_V$ is 99.9% while saw-tooth wave $W_S$ is about 3%. Actuator drive device 1 can provides a raster-scan display device having such high linearity. Actuator 2 driven by actuator drive device 1 displays a preferable image without distortion in scanning lines when the image is displayed by two-dimensional scanning.

According to Embodiment 1, frequency $f_{BW}$ is determined based on resonance frequency $f_1$ of the useless mode of actuator 2 and formula (6); however, the method is not limited to this. For instance, a swept sine-wave signal shaving a single period is applied to actuator 2 allows detector 3 that detects the drive mode of actuator 2 to obtain resonance frequency $f_0$ in the main mode of actuator 2 as well as resonance frequency $f_1$ in the useless mode. Then, frequency $f_{BW}$ can be determined with formula (6). This method also produces the same effects.

As described above, the saw-tooth wave produced by actuator drive device 1 allows the drive signal of actuator 2 to reduce a useless resonance in the resonance frequencies proper to actuator 2, and drives actuator 2 with a signal having a high linearity, thereby reducing distortion in the scanning lines during the raster scan.

The drive signal is calculated by formula (2); however, coefficient $a_k$ can be calculated to minimize evaluation function S shown in formula (7) with first derivative function V'(t) of function V(t).

$$S = \sum_{T/2-\Delta t}^{T/2+\Delta t} |V'(t) - m|^2 \quad (7)$$

Coefficient $a_k$ may be calculated to minimize second derivative function V''(t) of V(t) expressed as formula (8).

$$S = \sum_{T/2-\Delta t}^{T/2+\Delta t} |V''(t)|^2 \quad (8)$$

Formula (3) can be calculated with either evaluation functions S shown in formula (7) or (8) to provide the same effects as evaluation function S shown in formula (4).

Figure 10:
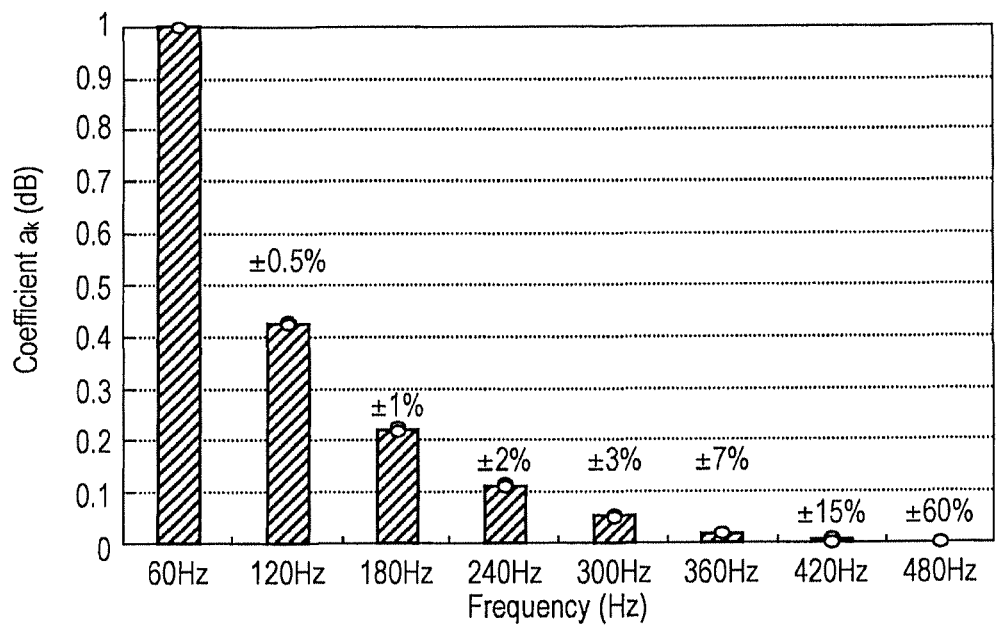
FIG. 10 shows tolerances of driving frequencies of the actuator drive device in accordance with Embodiment 1.

According to this embodiment, coefficient $a_k$ that minimizes evaluation function S expressed as formula (4) is found in order to produce a drive signal that maximizes the linearity. However, the value of coefficient $a_k$ is not limited to this one. FIG. 10 shows calculation result of coefficient $a_k$, and shows a tolerance of coefficient $a_k$ that decreases the linearity by about 3% with respect to the calculation results. The decreasing of linearity by not larger than 3% does not change a scanning state, so that actuator 2 may allow an image to be displayed without a distortion. Coefficient $a_k$ is thus determined within the range free from problematic distortion in linearity instead of strictly determining coefficient $a_k$ with formula (4). When coefficient $a_k$ is determined with formula (4), evaluation function S is calculated to determine its minimum value by using discrete values of time t. This calculation causes different values of evaluation function S depending on the number of values of time t. The larger the number of values of time t is, the larger the value of evaluation function S is. The smaller the number of values of time t, the smaller the value of evaluation function S is. The number $N_S$ of discrete values of time t provides a range expressed as formula (9) that minimizes evaluation function S regardless of number $N_S$. If evaluation function S satisfies formula (9), actuator 2 can be driven without degradation in linearity.

$$S/N_S < 0.0015 \quad (9)$$

Similarly, when evaluation function S satisfies formula (10) below, coefficient $a_k$ obtained by from formula (6) allows the actuator to be driven without degradation in linearity. When the value of evaluation function S is within the range determined by formula (11) below, coefficient $a_k$ obtained by formula (7) allows the actuator to be driven without degradation in linearity.

$$S/N_S < 6 \quad (10)$$

When the value of evaluation function S is within the range determined by formula (11) below, coefficient $a_k$ obtained by formula (7) allows the actuator to be driven without degradation in linearity.

$$S/N_S < 1100 \quad (11)$$

Drive signal D(t) calculated by processor (5) is produced in generator 6 as a driving signal for actuator 2. At this moment, a predetermined driving signal which drives only the main mode and does not have signals for the useless mode is applied to actuator 2. However, even when the drive signal that drives only the main mode is applied, actuator 2 does not necessarily vibrate in the same waveform as the drive waveform supplied due to the vibration characteristics of actuator 2.

Figure 11A:
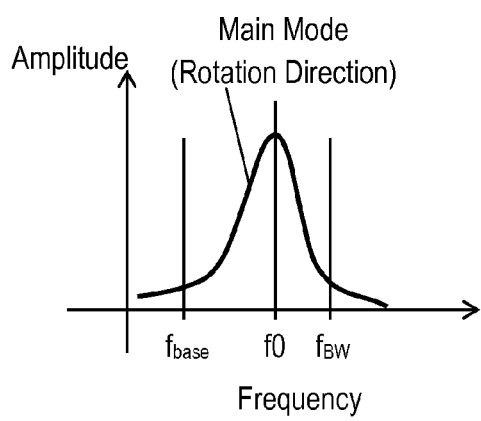
FIG. 11A shows frequency characteristics of amplitude in a main mode of the actuator in accordance with Embodiment 1.
Figure 11B:
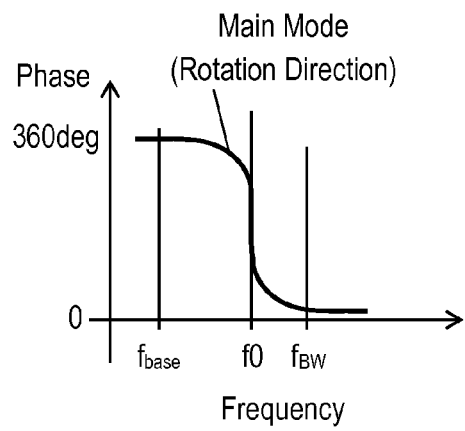
FIG. 11B shows frequency characteristics of a phase of the actuator in accordance with Embodiment 1.

FIG. 11A shows frequency characteristics of amplitude of vibration of actuator 2 only in the main direction. FIG. 11B shows frequency characteristics of the phase of the vibration. The amplitude becomes maximum around resonance frequency $f_0$ of the main mode, and the phase is reversed at resonance frequency $f_0$. As a result, even a driving signal having the same waveform as drive base signal V(t) input to the actuator produces distortions in the vibration of the main mode in response to the frequency characteristics of the amplitude and phase, hence causing degradation in the linearity.

In actuator drive device 1 in accordance with Embodiment 1, processor 5 calculates drive signal D(t) including drive base signal V(t) having the frequency characteristics previously obtained of the vibration in the main mode of actuator 2. Generator 6 applies, to actuator 2, the driving signal which has the same waveform as drive signal D(t).

Figure 12A:
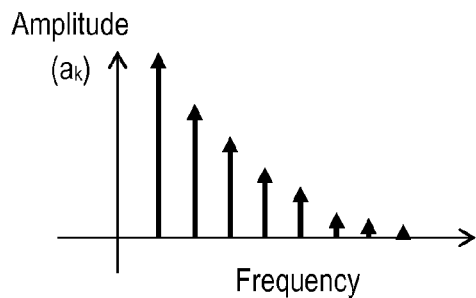
FIG. 12A shows a correction in the frequency characteristics of the actuator in accordance with Embodiment 1.
Figure 12B:
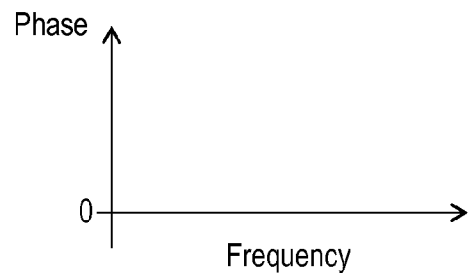
FIG. 12B shows a correction in the frequency characteristics of the actuator in accordance with Embodiment 1.
Figure 12C:
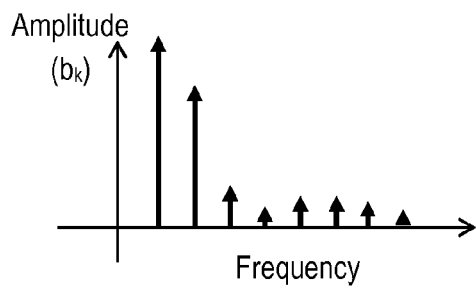
FIG. 12C shows a correction in the frequency characteristics of the actuator in accordance with Embodiment 1.
Figure 12D:
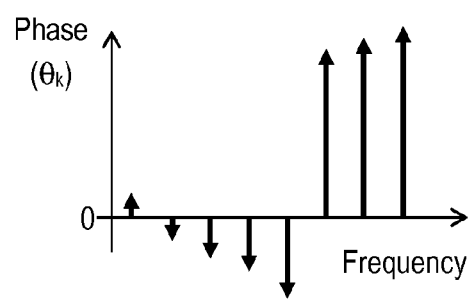
FIG. 12D shows a correction in the frequency characteristics of the actuator in accordance with Embodiment 1.

FIGS. 12A and 12B show the frequency characteristics of amplitude and phase of drive base signal V(t), respectively. FIGS. 12C and 12D show frequency characteristics of the vibration in the main mode of actuator 2, more particularly, the frequency characteristics of drive signal D(t) obtained by correcting drive base signal V(t). FIG. 12A shows the amplitude of drive base signal V(t) while FIG. 12B shows the phase of drive base signal V(t). FIG. 12C shows the amplitude of the corrected drive signal while FIG. 12D shows the phase of the corrected drive signal. Drive signal D(t) (=$D_2(t)$) can be expressed as formula (12).

$$D(t) = D_2(t) = A \sum_{k=1}^{N} b_k \sin(2\pi f_{base} k t + \theta_k) \quad (12)$$

When bias X is contained in the harmonic wave, drive signal D(t) (=$D_3(t)$) is expressed as formula (13).

$$D(t) = D_3(t) = A \sum_{k=1}^{N} b_k \sin(2\pi f_{base} k t + \theta_k) + X \quad (13)$$

The amplitude represented by coefficient $b_k$ is suppressed around resonance frequency $f_0$, and phase $\theta_k$ is reversed from a higher frequency band to a lower frequency band with respect to resonance frequency $f_0$. Thus, coefficient $a_k$ is adjusted to determine coefficient $b_k$ and phase $\theta_k$, and corrects drive base signal V(t) to finally calculate drive signals $D_2(t)$ and $D_3(t)$, thereby allowing actuator 2 to exhibit an ideal linearity. An amount of displacement of object 9 driven by actuator 2 can be corrected by detector 3. In the case that detector 3 is an optical detector implemented by a photo detector, detector 3 can detect an amount of displacement of actuator 2 as a waveform with the photo detector. Processor 5 compares a difference between the detected waveform of the displacement amount of detector 2 and drive base signal V(t) produced by actuator drive device 1, and correct drive base signal V(t) so as to minimize the difference, and then, calculates drive signals $D_2(t)$ and $D_3(t)$, thereby driving actuator 2 with a predetermined driving waveform. A difference between the driving signal produced by generator 6 and the waveform obtained by detector 3 within a short time within a period, and add this difference to a drive signal in the next period for producing drive signals $D_2(t)$ and $D_3(t)$. In this case, the signals are produced sequentially such that a difference between each short time becomes zero to reduce the degradation in the linearity caused by the resonance characteristics of actuator 2.

Figure 13A:
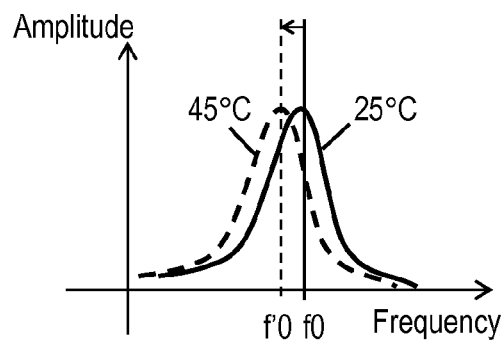
FIG. 13A shows changes in frequency characteristics of amplitude of the actuator caused by a temperature change in accordance with Embodiment 1.
Figure 13B:
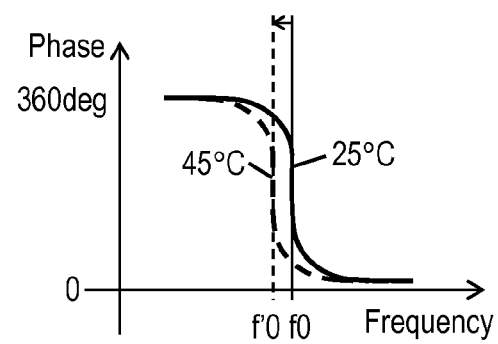
FIG. 13B shows changes in frequency characteristics of a phase of the actuator caused by a temperature change in accordance with Embodiment 1.
Figure 14:
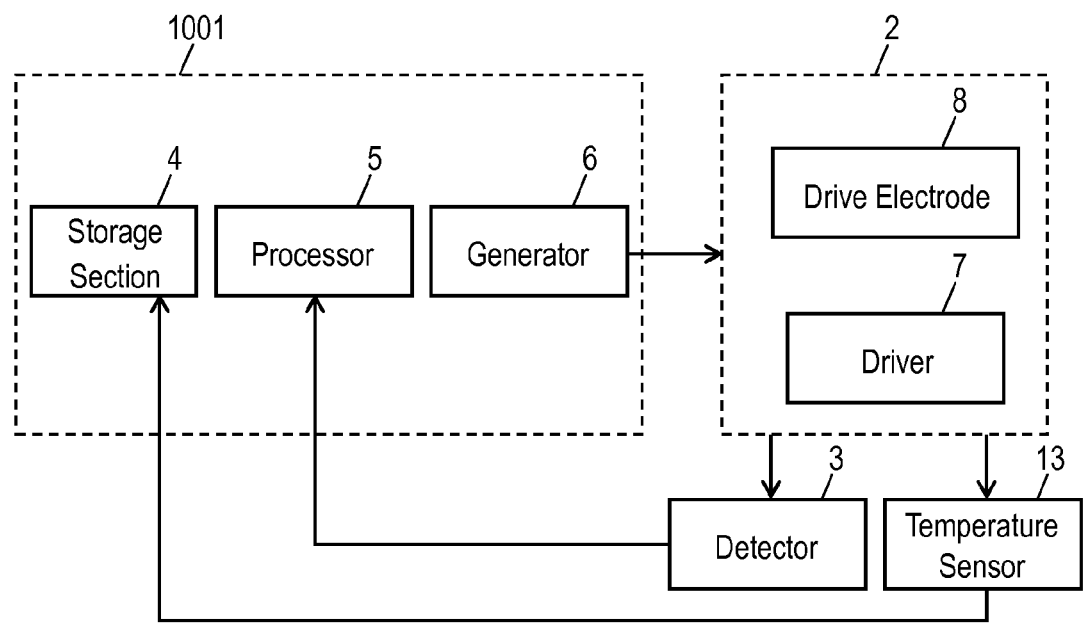
FIG. 14 is a block diagram of another actuator in accordance with Embodiment 1.
Figure 15A:
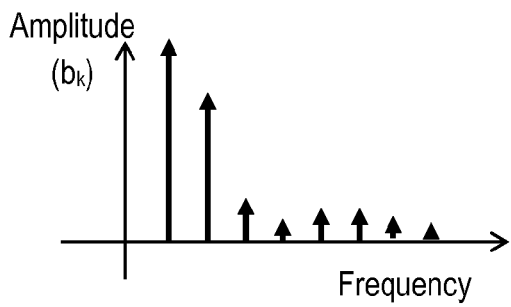
FIG. 15A shows a correction in frequency characteristics with respect to the temperature of the actuator in accordance with Embodiment 1.
Figure 15B:
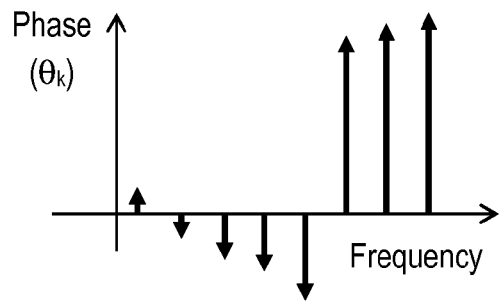
FIG. 15B shows a correction in frequency characteristics with respect to the temperature of the actuator in accordance with Embodiment 1.
Figure 15C:
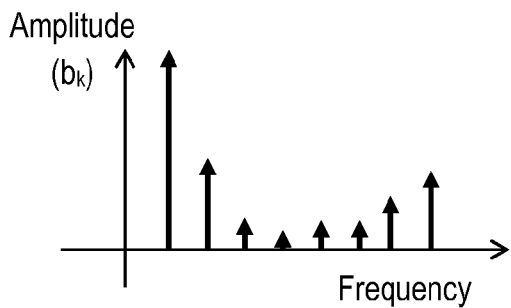
FIG. 15C shows a correction in frequency characteristics with respect to the temperature of the actuator in accordance with Embodiment 1.
Figure 15D:
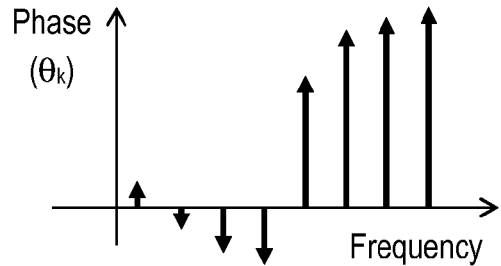
FIG. 15D shows a correction in frequency characteristics with respect to the temperature of the actuator in accordance with Embodiment 1.

FIG. 14 is a block diagram of another actuator drive device 1001 in accordance with Embodiment 1. In FIG. 14, components identical to those of actuator drive device 1 shown in FIG. 1 are denoted by the same reference numerals. Actuator drive device 1001 shown in FIG. 14 further includes temperature sensor 13 for sensing an ambient temperature of actuator 2. The frequency characteristics of actuator 2 change depending on the ambient temperature. Actuator drive device 1001 can correct the change caused by the ambient temperature. FIG. 13A shows changes in the characteristics of the amplitude of actuator 2, caused by ambient temperature change. FIG. 13B shows changes in the characteristics of the phase of actuator 2 caused by ambient temperature change. Storage section 4 previously stores a table containing correction amounts of the frequency characteristics in response to the temperature changes. FIGS. 15A and 15B show the frequency characteristics of the amplitudes (coefficient $b_k$) and the phases ($\theta_k$) of drive signals $D_2(t)$ and $D_3(t)$ at temperature of 25° C. recorded in the table of storage section 4. FIGS. 15C and 15D show the frequency characteristics of the amplitudes (coefficient $b_k$) and the phases ($\theta_k$) of drive signals $D_2(t)$ and $D_3(t)$ at a temperature of 45° C. recorded in the table of storage section 4. When the ambient temperature of actuator 2 is 25° C., processor 5 refers to coefficient $b_k$ and phases $\theta_k$ shown in FIGS. 15A and 15B for producing drive signals $D_2(t)$ and $D_3(t)$. When the ambient temperature of actuator 2 becomes 45° C., processor 5 refers to coefficient $b_k$ and phases $\theta_k$ shown in FIGS. 15C and 15D for producing drive signals $D_2(t)$ and $D_3(t)$.

As discussed above, the tables in response to the temperature changes are recorded, and temperature sensor 13 disposed around actuator 2 detects the ambient temperature, and changes the tables to be referred to for producing drive signals $D_2(t)$ and $D_3(t)$. Reference to the tables, corresponding to each condition, in response to the detected temperature suppresses changes in the linearity of the drive signal for actuator 2 caused by temperature change.

According to Embodiment 1, the two tables are changed from each other to calculate drive signals $D_2(t)$ and $D_3(t)$ for actuator 2. The number of the tables is not limited to two. For instance, more than two tables may be referred to for correcting the temperature changes.

Exemplary Embodiment 2

An optical scanning device in accordance with Exemplary Embodiment 2 of the present invention includes actuator drive device 1 shown in FIG. 1 in accordance with Embodiment 1, actuator 2, and detector 3.

Actuator drive device 1 includes storage section 4 for storing drive conditions input previously therein, processor 5 for calculating drive signal D(t) by calculating drive base signal V(t) based on the drive condition stored in storage section 4 so as to form a predetermined driving waveform, and generator 6 for producing a driving signal based on drive signal D(t) calculated by processor 5. Actuator 2 includes drivers 7 the number of which corresponds to the number of axes to be driven and drive electrodes 8 for driving the drivers 7. Actuator 2 is driven in axial directions in response to electrical driving signals produced by generator 6 of actuator drive device 1.

Actuator 2 in accordance with Embodiment 2 is similar to the actuator in accordance with Embodiment 1 shown in FIG. 3.

An operation of the optical scanning device and actuator drive device 1 in accordance with Embodiment 2 will be described below.

Figure 16:
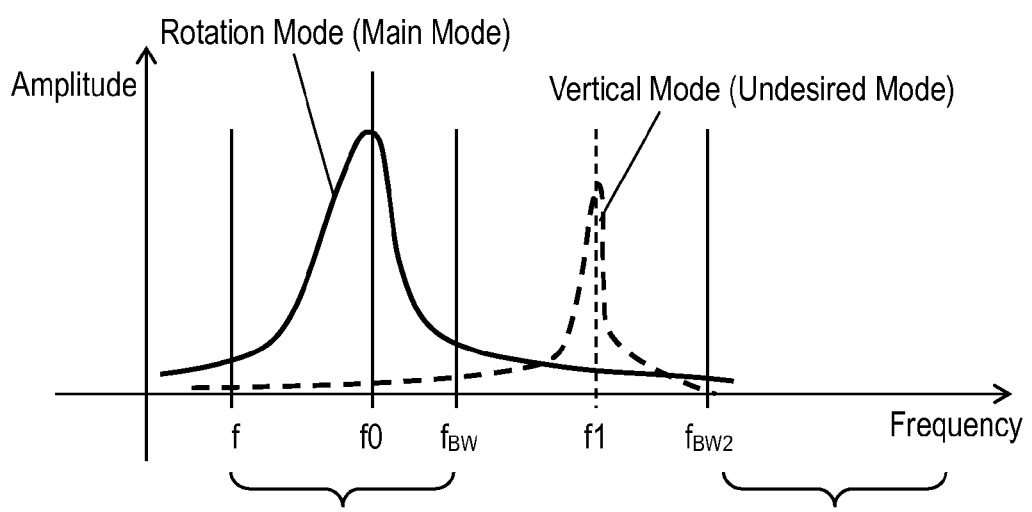
FIG. 16 shows frequency characteristics of amplitude of vibration of an actuator in accordance with Exemplary Embodiment 2 of the present invention.

According to Embodiment 1, the frequency band of the components of drive base signal V(t) and drive signal D(t) is within the range of $f_{base} < kf_{base} < f_{BW}$. The frequency band is not limited to this one range. According to Embodiment 2, drive signal D(t) contains components of plural frequency bands excluding a useless mode. FIG. 16 shows a range in which the vibration energy of the useless mode is larger than that of the main mode, namely the range from frequency $f_{BW}$ to frequency $f_{BW2}$. As discussed above, actuator drive device 1 in accordance with Embodiment 2 can set a frequency of the component of drive signal D(t) in a range other than the range in which the vibration energy in the useless mode is larger than that in the main mode. The case that frequency $f_{BW}$ is set for two ranges will be described below. For instance, in the case that frequency $kf_{base}$ of the component of drive signal D(t) is set in the frequency range from 60 to 500 Hz and the frequency range from 630 to 1200 Hz based on the frequency characteristics of the vibration in the useless mode, The number N is 1, 2, 3, 4, 5, 6, 7, 8, 11, . . . , 20. Coefficient $a_k$ corresponding to integer k can be determined by setting duration Δt by using the flowchart shown in FIG. 8A similarly to Embodiment 1. The waveform of drive signal D(t) obtained above has a linearity of 99.6% as large as that according to Embodiment 1.

Actuator drive devices 1 and 1001 in accordance with Embodiments 1 and 2 can advantageously obtain drive signal D(t) having a high linearity in response to any frequency $f_{BW}$, thus being useful for actuator 2 that needs a linearity for display devices.

INDUSTRIAL APPLICABILITY

An actuator drive device according to the present invention can drive an actuator with high linearity, and can be used in a small size projector or a head-mount type display.

DESCRIPTION OF REFERENCE MARKS

1 Actuator Drive Device
2 Actuator
4 Storage section
5 Processor
6 Generator
7 Driver
8 Drive Electrode
9 Object
10 Driver
13 Temperature Sensor

The invention claimed is:

1. An actuator drive device configured to drive an actuator which includes a driver and a drive electrode, said actuator drive device comprising:
   a storage section for storing a drive condition of the actuator;
   a processor for calculating and outputting drive signal D(t) based on a drive base signal V(t) calculated based on the drive condition with respect to time t; and
   a generator for outputting, based on the drive signal D(t) calculated, a driving signal to the drive electrode of the actuator for driving the driver of the actuator,
   wherein the actuator drive device is configured to drive the actuator in a main mode while not exciting the actuator in a mode different from the main mode,
   wherein the drive base signal V(t) is a sum of a fundamental wave and at least one harmonic wave of the fundamental wave, and is expressed as:

$$V(t) = A \sum_{k=1}^{N} a_k \sin(2\pi f_{base} kt),$$

with an amplitude A, an integer N, a coefficient $a_k$, a frequency $f_{base}$ of the fundamental wave, and an integer k (1≤k≤N),
   wherein frequencies of the fundamental wave and the at least one harmonic wave of the fundamental wave includes a resonance frequency $f_0$ of the main mode,
   wherein the mode, different from the main mode, is excited with a vibration at a resonance frequency $f_1$,
   wherein an upper limit frequency out of the frequencies of the fundamental wave and the at least one harmonic wave of the fundamental wave is a frequency $f_{BW}$,
   wherein a frequency $kf_{base}$ of a harmonic wave out of the at least one harmonic wave at any order k is included within a range of $f_{base} \le kf_{base} \le f_{BW} \le f_1$, and
   wherein the processor is operable to determine the coefficient $a_k$ such that the drive base signal V(t) changes linearly from a minimum value to a maximum value with respect to a time.

2. The actuator drive device according to claim 1, wherein the processor outputs the drive base signal V(t) as the drive signal D(t).

3. The actuator drive device according to claim 1, wherein the drive signal D(t) is expressed as:

$$D(t)=V(t)+X,$$

with the drive base signal V(t) and a bias X.

4. The actuator drive device according to claim 1, wherein an evaluation function S is expressed as:

$$S = \sum_{T/2-\Delta t}^{T/2+\Delta t} |V(t)-(mt+n)|^2$$

with a period $T(=1/f_{base})$ of the drive base signal V(t), a duration $\Delta t$ which is a half of a duration from the minimum value to the maximum value, and integers m and n, and
wherein the coefficient $a_k$ is determined to satisfy $S/N_S < 0.0015$ with a discrete value $N_S$ of the time t.

5. The actuator drive device according to claim 1, wherein an evaluation function S is expressed as:

$$S = \sum_{T/2-\Delta t}^{T/2+\Delta t} |V'(t)-m|^2$$

with a period $T(=1/f_{base})$ of the drive base signal V(t), a duration $\Delta t$ which is a half of a duration from the minimum value to the maximum value, and an integer m, and
wherein the coefficient $a_k$ is determined to satisfy $S/N_S < 6$ with a discrete value $N_S$ of the time t.

6. The actuator drive device according to claim 1, wherein an evaluation function S is expressed as:

$$S = \sum_{T/2-\Delta t}^{T/2+\Delta t} |V''(t)|^2$$

with a period $T(=1/f_{base})$ of the drive base signal V(t) and a duration $\Delta t$ which is a half of a duration from the minimum value to the maximum value, and
wherein the coefficient $a_k$ of the harmonic wave is determined to satisfy $S/N_S < 1100$ with a discrete value $N_S$ of the time t.

7. The actuator drive device according to claim 1, wherein a highest frequency $Nf_{base}$ of the at least one harmonic wave is a frequency $f_{BW}$, and
wherein the frequency $f_{BW}$ is determined by:

$$A_d(f_{BW}) > A_u(f_{BW})+3 \text{ dB},$$

with an amplitude characteristic $A_d(f)$ (dB) of a main mode of the actuator with respect to a frequency f, and an amplitude characteristic $A_u(f)$ (dB) of an undesired mode of the actuator with respect to the frequency f.

8. The actuator drive device according to claim 7, wherein the frequency $f_{BW}$ is 1200 Hz.

9. The actuator drive device according to claim 1, wherein components of the drive base signal V(t) is expressed as:

$$a_k \sin(2\pi f_{base}kt), \text{ and}$$

wherein at least one predetermined component of the components is removed from the drive signal D(t).

10. The actuator drive device according to claim 1, wherein the processor is operable to correct the coefficient $a_k$ in response to an ambient temperature of the actuator as to calculate the drive signal D(t).

11. The actuator drive device according to claim 1, wherein the processor is operable to correct the coefficient $a_k$ in response to a vibration of the actuator as to calculate the drive signal D(t).

12. The actuator drive device according to claim 1, wherein the drive signal D(t) is expressed as:

$$D(t) = A\sum_{k=1}^{N} b_k \sin(2\pi f_{base}kt + \theta_k)$$

with a coefficient $b_k$ and a phase $\theta_k$, and
wherein the processor is operable to correct the coefficient $a_k$ in response to a vibration of the actuator as to calculate the coefficient $b_k$ and the phase $\theta_k$.

13. The actuator drive device according to claim 12, wherein the processor is operable to correct the coefficient $b_k$ and the phase $\theta_k$ in response to an ambient temperature of the actuator.

14. The actuator drive device according to claim 1, wherein the drive signal D(t) is expressed as:

$$D(t) = A\sum_{k=1}^{N} b_k \sin(2\pi f_{base}kt + \theta_k)$$

with a coefficient $b_k$, a phase $\theta_k$, and a bias X, and
wherein the processor is operable to correct the coefficient $a_k$ in response to a vibration of the actuator as to calculate the coefficient $b_k$ and the phase $\theta_k$.

15. The actuator drive device according to claim 14, wherein the processor is operable to correct the coefficient $b_k$ and the phase $\theta_k$ in response to an ambient temperature of the actuator.

16. The actuator drive device according to claim 1, wherein the drive signal D(t) is expressed as:

$$D(t) = A\sum_{k=1}^{N} b_k \sin(2\pi f_{base}kt + \theta_k)$$

with a coefficient $b_k$, and
wherein the processor is operable to correct the coefficient $a_k$ in response to a vibration of the actuator as to calculate the coefficient $b_k$.

17. The actuator drive device according to claim 16, wherein the processor is operable to correct the coefficient $b_k$ in response to an ambient temperature of the actuator.

18. The actuator drive device according to claim 1, wherein the drive signal D(t) is expressed as:

$$D(t) = A\sum_{k=1}^{N} b_k \sin(2\pi f_{base}kt) + X$$

with a coefficient $b_k$ and a bias X, and
wherein the processor is operable to correct the coefficient $a_k$ in response to a vibration of the actuator as to calculate the coefficient $b_k$.

19. The actuator drive device according to claim 18, wherein the processor is operable to correct the coefficient $b_k$ in response to an ambient temperature of the actuator.

20. The actuator drive device according to claim 1, wherein the processor is operable to determine the coefficient $a_k$ such that:

the drive base signal changes linearly from a minimum value to a maximum value with respect to a time for a predetermined duration within a period of the fundamental wave; and the drive base signal changes not linearly from the minimum value to the maximum value with respect to a time for at least a part of a duration within the period of the fundamental wave other than the predetermined duration.

* * * * *